United States Patent
Oka

(10) Patent No.: US 7,321,265 B2
(45) Date of Patent: Jan. 22, 2008

(54) DISTORTION COMPENSATING CIRCUIT HAVING NEGATIVE GAIN DEVIATION, POWER AMPLIFIER USING THE SAME, AND COMMUNICATION DEVICE HAVING POWER AMPLIFIER

(75) Inventor: Tohru Oka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 127 days.

(21) Appl. No.: 11/247,292

(22) Filed: Oct. 12, 2005

(65) Prior Publication Data

US 2006/0114066 A1    Jun. 1, 2006

(30) Foreign Application Priority Data

Nov. 29, 2004    (JP) .............................. 2004-344591

(51) Int. Cl.
*H03F 1/26*    (2006.01)

(52) U.S. Cl. ....................................... 330/149; 330/302

(58) Field of Classification Search ................. 330/149, 330/302, 306, 136, 145
See application file for complete search history.

(56) References Cited

U.S. PATENT DOCUMENTS 6,933,780 B2 *    8/2005    Fujiwara et al. ............ 330/149

FOREIGN PATENT DOCUMENTS

| JP | 2001-144550 A | 5/2001 |
| JP | 3335907 B2 | 8/2002 |

* cited by examiner

*Primary Examiner*—Robert Pascal
*Assistant Examiner*—Hieu Nguyen
(74) *Attorney, Agent, or Firm*—Birch, Stewart, Kolasch & Birch, LLP

(57) ABSTRACT

There is used a distortion compensating circuit having a structure in which a circuit including a diode is connected between a signal path and a ground, wherein a voltage applied to the diode is a forward bias voltage, and an amount of change in a ratio between output power output from the signal path and input power input to the signal path with respect to the input power is zero or negative.

15 Claims, 8 Drawing Sheets

DISTORTION COMPENSATING CIRCUIT HAVING NEGATIVE GAIN DEVIATION, POWER AMPLIFIER USING THE SAME, AND COMMUNICATION DEVICE HAVING POWER AMPLIFIER

This nonprovisional application is based on Japanese Patent Application No. 2004-344591 filed with the Japan Patent Office on Nov. 29, 2004, the entire contents of which are hereby incorporated by reference.

BACKGROUND OF THE INVENTION

1. Field of the Invention

The present invention relates to a distortion compensating circuit, a power amplifier using the same, and a communication device having the power amplifier. In particular, the present invention relates to a distortion compensating circuit used in a wireless communication device or the like requiring low-distortion amplification, a power amplifier using the same, and the communication device.

2. Description of the Background Art

In current wireless communication systems such as a wireless LAN (Local Area Network) system and a mobile phone, a dominant technology is digital modulation and demodulation such as OFDM (Orthogonal Frequency Division Multiplex) and QPSK (Quadrature Phase Shift Keying). In these digital modulation and demodulation schemes, information is carried by using both a phase and an amplitude of a signal, and thus a power amplifier is required to linearly amplify an input signal. Further, in a power amplifier for transmission consuming much of power consumption of the system during transmission, the power amplifier is also required to operate with high efficiency in order to achieve system miniaturization and low power consumption.

As a technique for enhancing linearity of a power amplifier, there has been proposed a method of canceling distortion by providing, at a preceding stage or a subsequent stage of a power amplifying element used in a power amplifier, a distortion compensating circuit having nonlinearity contrary to the power amplifying element. As an example of a conventional distortion compensating circuit, a technique for connecting a circuit including a diode between a signal path and a ground has been disclosed (see for example Japanese Patent Laying-Open No. 2001-144550).

FIG. 9 is a circuit block diagram of a conventional distortion compensating circuit 100.

Referring to FIG. 9, conventional distortion compensating circuit 100 has an input terminal 101, capacitors 102, 103 and 110, an output terminal 104, a diode 105, resistors 106 and 108, and a direct-current power source 109.

Diode 105 has an anode terminal electrically coupled to a connecting node between capacitor 102 and capacitor 103, and a cathode terminal grounded via resistor 106. Direct-current power source 109 is connected to the anode. terminal of diode 105 via resistor 108, and a forward bias voltage is applied to diode 105. Capacitor 110 is connected to a connecting node between resistor 108 and direct-current power source 109, and the connecting node is grounded via capacitor 110.

Hereinafter, an operation of conventional distortion compensating circuit 100 will be described.

A signal input from input terminal 101 is output to output terminal 104 via capacitors 102 and 103. However, a portion of the signal leaks to ground via diode 105 and resistor 106 connected between capacitor 102 and capacitor 103, and via resistor 108 and capacitor 110. Since an increase in the input signal leads to increased power of the signal input to diode 105, a flow of direct current is produced by the rectification function of the diode, and a bias point of the diode moves.

FIG. 10 illustrates the movement of the bias point in conventional distortion compensating circuit 100.

Referring to FIG. 10, a curve 111 indicates a current-voltage characteristic of a diode when a signal is not input. When an input signal is small, the diode operates on a small-signal bias point S' on curve 111. On the other hand, when input power is increased, a flow of direct current is produced by the rectification function of the diode as described above, and the current-voltage characteristic of the diode changes from curve 111 to a curve 112.

As a result, the bias point moves from small-signal bias point S' to a large-signal bias point L', along a load line 113 determined by resistors 106 and 108.

A resistance component of a diode with respect to high-frequency power is represented by an RF (radio frequency) resistance value, which corresponds to the reciprocal of the slope of a tangent to the curve indicating a current-voltage characteristic at a bias point. When power of a signal input to the diode is increased, the bias point moves from point S' to point L', and the tangent has a gentler slope, as shown in FIG. 10. That is, the RF resistance value of the diode increases. Accordingly, the amount of signal power leak to diode 105 is reduced with the increase in the input power, and as a result, output power from output terminal 104 increases with the increase in the input power. FIG. 11 shows this result.

FIG. 11 illustrates relationship between input power and gain, that is, power ratio between an output signal and an input signal, of a conventional distortion compensating circuit.

As shown in FIG. 11, the amount of gain reduction decreases with an increase in the input power. This indicates that the distortion compensating circuit has positive gain deviation, that is, it has a function of suppressing negative gain deviation. The positive gain deviation in the distortion compensating circuit can be adjusted by a power supply voltage of direct-current power source 109, which has been disclosed for example in Japanese Patent No. 3335907. The negative gain deviation can be suppressed by reducing the power supply voltage as shown in FIG. 11.

It is generally know that, to operate a power amplifier with high efficiency, a direct bias current in a power amplifying element used in the power amplifier should be reduced.

If the direct bias current is reduced, however, gain of the power amplifying element tends to increase with an increase in output power before the output power is saturated.

FIG. 12 illustrates relationship between output power and both gain and power efficiency of a power amplifying element.

As shown in FIG. 12, gain variation associated with an increase in the output power means that the linearity of a power amplifier is deteriorated. FIG. 12 indicates that improving the power efficiency and improving the linearity are in trade-off relationship.

Therefore, in order to operate a power amplifier with high linearity and with high efficiency, a distortion compensating circuit is required which can suppress gain increase caused when a direct bias current in a power amplifying element is reduced, that is, positive gain deviation.

However, since a distortion compensating circuit according to the above conventional technique has positive gain deviation, there has been a problem that it cannot be applied as a distortion compensating circuit for a power amplifying element having positive gain deviation.

SUMMARY OF THE INVENTION

The present invention has been made to solve the problem in a conventional distortion compensating circuit as described above. One object of the present invention is to provide a distortion compensating circuit capable of suppressing positive gain deviation in an power amplifying element caused by reducing a direct bias current for highly efficient operation, that is, a distortion compensating circuit having negative gain deviation, a power amplifier capable of achieving operation with high efficiency and with high linearity simultaneously by using the same, and a communication device having the power amplifier.

A distortion compensating circuit in accordance with the present invention has a structure in which a circuit including a diode is connected between a signal path and a ground. A voltage applied to the diode is a forward bias voltage, and an amount of change in a ratio between output power output from the signal path and input power input to the signal path with respect to the input power is zero or negative.

Preferably, the voltage applied to the diode is a forward bias voltage having a current density of a direct bias current flowing to the diode of not more than $10^2$ A/cm$^2$.

According to the distortion compensating circuit in accordance with the present invention, the voltage applied to the diode is a forward bias voltage, and the amount of change in the ratio between output power output from the signal path and input power input to the signal path with respect to the input power is zero or negative. With this arrangement, a bias point of the diode moves with an increase in the input power to reduce an RF resistance value of the diode, and as a result, a distortion compensating circuit in which output power decreases with an increase in input power, that is, a distortion compensating circuit having negative gain deviation, can be provided. Therefore, since an operation with high efficiency and high linearity is performed with a simple structure, miniaturization, reduced power consumption, and even cost reduction can be achieved.

A power amplifier in accordance with the present invention includes a power amplifying element having positive gain deviation with an increase in output power, and the distortion compensating circuit described above.

Preferably, the distortion compensating circuit is provided in a preceding stage of the power amplifying element.

Preferably, the power amplifying element is formed of a bipolar transistor.

In particular, the diode is made of at least one of an emitter-base junction and a base-collector junction of the bipolar transistor.

Preferably, the distortion compensating circuit is provided at least in a preceding stage of the power amplifying element in a final output stage of a multi-stage power amplifier including a plurality of the power amplifying elements.

Since the power amplifier in accordance with the present invention includes the distortion compensating circuit described above, miniaturization, reduced power consumption, and even cost reduction of the power amplifier can be achieved.

A communication device in accordance with the present invention includes the power amplifier described above.

Preferably, the power amplifier is a power amplifier for transmission.

Since the communication device in accordance with the present invention includes the power amplifier described above, miniaturization, reduced power consumption, and even cost reduction of the communication device can be achieved, as well as extended communication duration and battery miniaturization.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
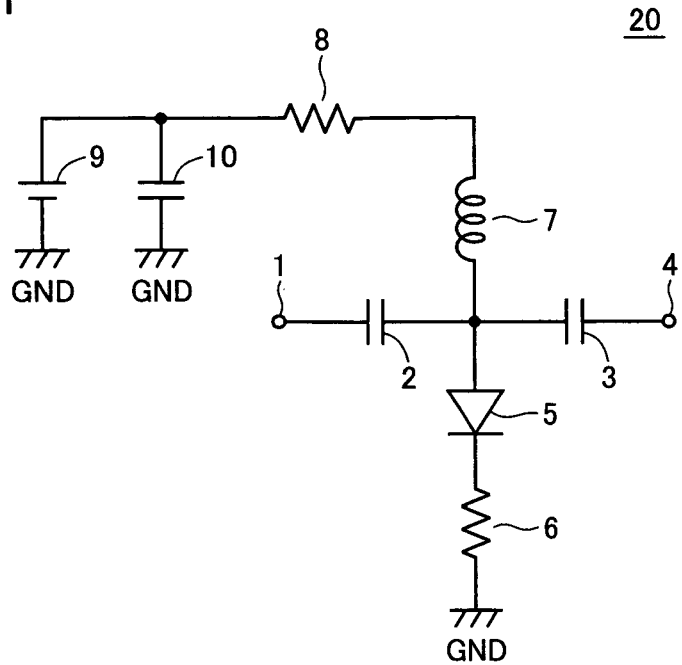
FIG. 1 is a circuit block diagram of a distortion compensating circuit in accordance with a first embodiment of the present invention.

Hereinafter, embodiments of the present invention will be described in detail with reference to the drawings. It is to be noted that identical or corresponding parts in the drawings will be designated by the same reference numerals, and the description thereof will not be repeated.

First Embodiment

Referring to FIG. 1, a distortion compensating circuit 20 in accordance with a first embodiment of the present invention has an input terminal 1, capacitors 2, 3 and 10, an output terminal 4, a diode 5, resistors 6 and 8, an inductor 7, and a direct-current power source 9.

Diode 5 has an anode terminal electrically coupled to a connecting node between capacitor 2 and capacitor 3, and a cathode terminal grounded via resistor 6. Direct-current power source 9 is connected to the anode terminal of diode 5 via inductor 7 and resistor 8, and a forward bias voltage of not more than a turn-on voltage $V_{on}$ is applied to diode 5.

A connecting node between resistor 8 and direct-current power source 9 is grounded via capacitor 10. It is to be noted that diode 5 is connected so that the forward bias voltage is applied thereto. For example, diode 5 may also be structured such that the cathode terminal is connected to the connecting node between capacitor 2 and capacitor 3 and the direct-current power source is connected to the anode terminal side. Further, a resistor or an inductor may be added or removed as appropriate, depending on design specification of the circuit.

Hereinafter, an operation of distortion compensating circuit 20 in accordance with the first embodiment of the present invention will be described.

A signal input from input terminal 1 is output to output terminal 4 via capacitors 2 and 3. However, a portion of the signal leaks to ground via diode 5 and resistor 6 connected between capacitor 2 and capacitor 3, and via inductor 7, resistor 8 and capacitor 10.

Since an increase in the input signal leads to increased power of the signal input to diode 5, a flow of direct current is produced by the rectification function of the diode. The direct current produced by the rectification function, that is, an increased amount of the direct current, varies depending on the magnitude of the power of the signal leaking to the diode, that is, high-frequency power, and a bias point of the diode, as described above. This results from the fact that the diode has a nonlinear operational characteristic represented by the following expression:

$$Id = Is \cdot \{\exp(qV_d/kT) - 1\},$$

where Id is a current in the diode, Is is a reverse saturation current in the diode, q is the amount of elementary charge ($\approx 1.6 \times 10^{-19}$ C), k is Boltzmann constant ($\approx 1.38 \times 10^{-23}$ J·K$^{-1}$), T is the absolute temperature, and $V_d$ is a direct bias voltage applied to the diode.

When high-frequency power having a voltage amplitude $v_{in}$ and an angular frequency $\omega$ is input to the diode, the current flowing to the diode is represented by the following expression:

$$Id \approx Is \cdot \exp\{q(V_d + v_{in} \cos(\omega t))/kT\},$$

where t is time.

If the above expression is used to determine the direct current flowing to the diode when the high-frequency power is input, the following expression is obtained:

$$Id_{dc} = Is \cdot \exp(qV_d/kT) \cdot I_0(qv_{in}/kT),$$

where function $I_0(x)$ is the zero-order modified Bessel function of the first kind, which is a monotonic increasing function with respect to x.

From the above expression, it can be understood that the direct current flowing to the diode increases with an increase in voltage $V_d$ applied to the diode, and with an increase in voltage amplitude vin input to the diode.

Figure 2:
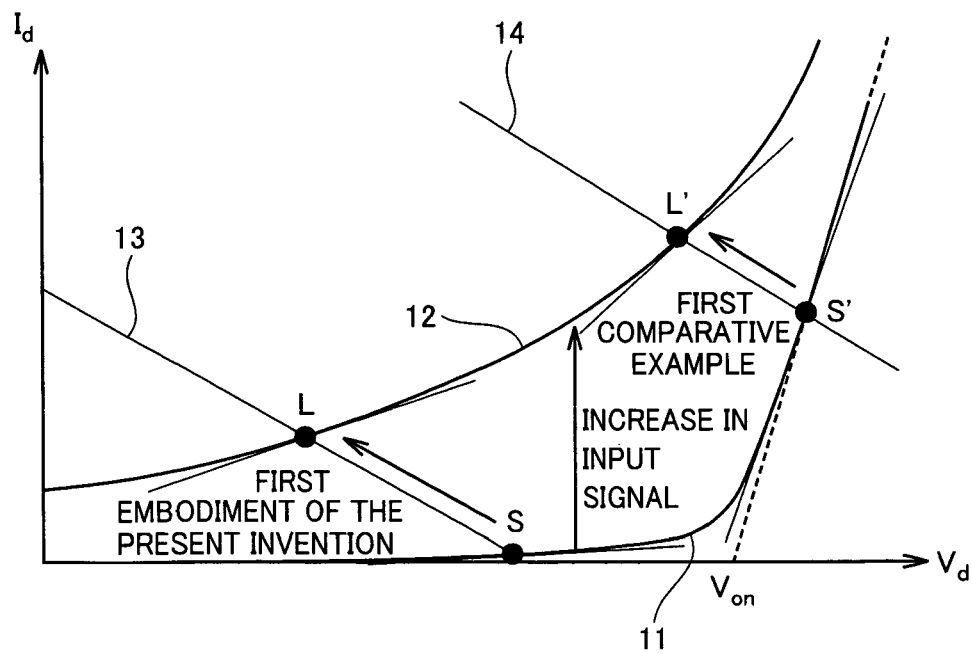
FIG. 2 illustrates movement of a bias point in the distortion compensating circuit in accordance with the first embodiment of the present invention.

Referring to FIG. 2, explanation will be given on movement of the bias point in distortion compensating circuit 20 in accordance with the first embodiment of the present invention. The current-voltage characteristic of the diode to which a large signal is input changes from a curve 11 to a curve 12 as shown in FIG. 2, and the bias point of the diode moves.

In FIG. 2, $V_{on}$ is the turn-on voltage. In the structure in accordance with the first embodiment, the bias voltage for the diode is set at not more than turn-on voltage $V_{on}$. A point S is a small-signal bias point in the first embodiment. A point L is a large-signal bias point in the first embodiment.

In contrast, a point S' and a point L' indicate a small-signal bias point and a large-signal bias point, respectively, when the bias voltage for the diode is set at more than turn-on voltage $V_{on}$, as a first comparative example.

The diode in accordance with the first embodiment is for example a GaAs PIN diode having a turn-on voltage of 1.2 V. In the first embodiment, the bias voltage applied to the diode and the current density of the direct bias current are set at 1.0 V and 1 A/cm$^2$, respectively.

In contrast, in the first comparative example, the bias voltage applied to the diode and the current density of the direct bias current are set at 1.3 V and 5×10$^2$ A/cm$^2$, respectively.

When an input signal is small, the diode operates on small-signal bias points S and S' on curve 11. When input power is increased, a flow of rectification current is produced, changing the current-voltage characteristic of the diode. The bias points move from small-signal bias points S and S' on curve 11 to large-signal bias points L and L' on curve 12, respectively, along load lines 13 and 14 determined by resistors 6 and 8.

In the first embodiment in which the bias voltage for the diode is not more than turn-on voltage $V_{on}$, the slope of a tangent to the curve indicating the current-voltage characteristic at the bias point increases with an increase in input power. Specifically, the RF resistance value of the diode decreases with the increase in the input power. Accordingly, the amount of signal power leak to diode 5 increases with the increase in the input power, and as a result, output power from output terminal 4 decreases with the increase in the input power.

In contrast, in the first comparative example in which the bias voltage for the diode is more than turn-on voltage $V_{on}$, the slope of a tangent to the curve indicating the current-voltage characteristic at the bias point decreases with an increase in input power. Specifically, the RF resistance value of the diode increases with the increase in the input power. Accordingly, the amount of signal power leak to diode 5 decreases with the increase in the input power, and as a result, output power from output terminal 4 increases with the increase in the input power.

Figure 3:
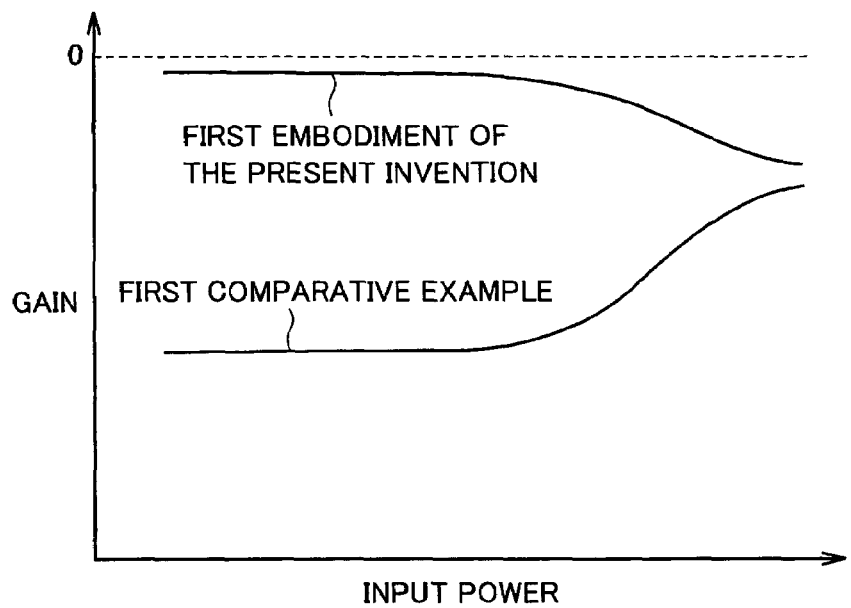
FIG. 3 illustrates relationship between input power and gain of the distortion compensating circuit in accordance with the first embodiment of the present invention, as well as relationship between input power and gain in a first comparative example.

Referring to FIG. 3, explanation will be given on relationship between input power and gain of the distortion compensating circuit in accordance with the first embodiment of the present invention, as well as relationship between input power and gain in the first comparative example.

As shown in FIG. 3, in the first embodiment of the present invention, the amount of gain reduction increases with an increase in input power. This indicates that the distortion compensating circuit in accordance with the first embodiment has negative gain deviation, that is, it has a function of suppressing positive gain deviation. It is to be noted that, although the bias voltage applied to the diode and the current density of the direct bias current are set at 1.0 V and 1 A/cm$^2$, respectively, in the present embodiment, a similar effect can be obtained if the voltage applied to the diode is a forward bias voltage having a current density of the direct bias current of not more than $10^2$ A/cm$^2$. Specifically, a distortion compensating circuit having negative gain deviation with minimum power consumption in a diode can be achieved by setting a voltage applied to the diode at a forward bias voltage having a current density of a direct bias current flowing to the diode of not more than $10^2$ A/cm$^2$.

As described above, in distortion compensating circuit 20 in accordance with the first embodiment of the present invention, the voltage applied to the diode is set at a forward bias voltage of not more than the turn-on voltage such that the amount of change in the ratio between output power output from a signal path and input power input to the signal path with respect to the input power is zero or negative, and thus the bias point of the diode moves with the increase in the input power, reducing the RF resistance value of the diode. Accordingly, the amount of signal power leak to the diode can be increased with the increase in the input power. As a result, a distortion compensating circuit in which output power decreases with an increase in input power, that is, a distortion compensating circuit having negative gain deviation, can be provided.

It is to be noted that, although a GaAs PIN diode is used as the diode in the present embodiment, a PIN diode using another semiconductor element such as Si or InP can also be used. Further, other than a PIN diode, a pn junction diode or a Schottky junction diode can also be applied.

Second Embodiment

Figure 4:
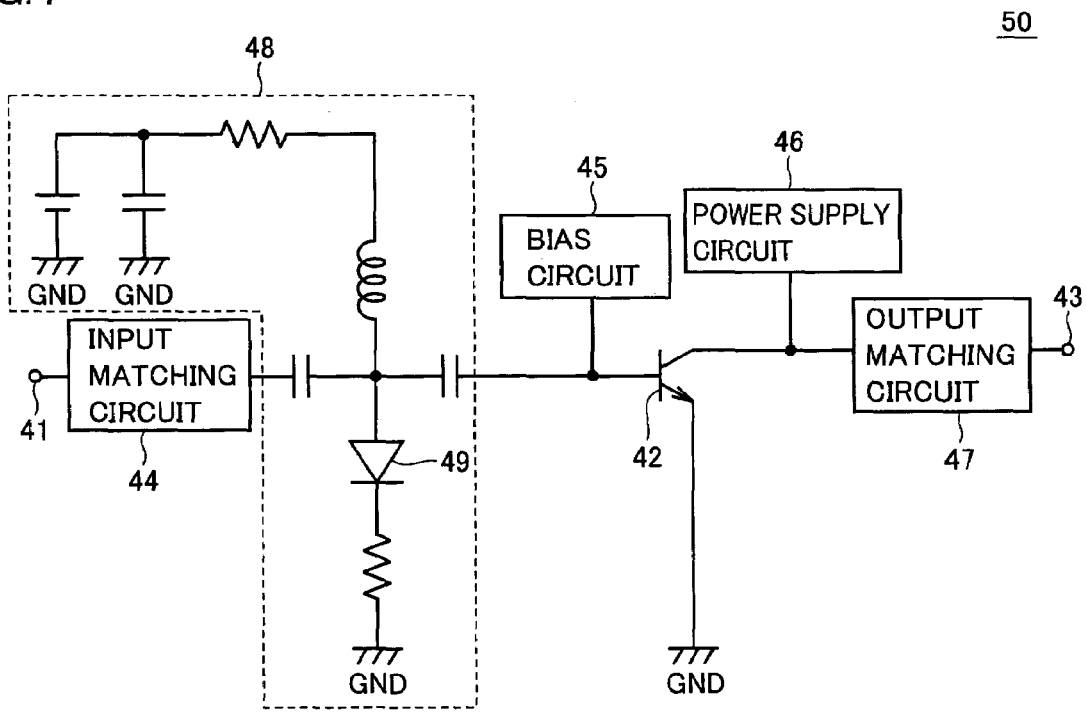
FIG. 4 is a circuit block diagram of a power amplifier in accordance with a second embodiment of the present invention.

Referring to FIG. 4, a power amplifier 50 in accordance with a second embodiment of the present invention includes an input terminal 41, a power amplifying element 42, an output terminal 43, an input matching circuit 44, a bias circuit 45 on the input side of power amplifying element 42, a power supply circuit 46 on the output side of power amplifying element 42, an output matching circuit 47, and a distortion compensating circuit 48.

Distortion compensating circuit 48 is equivalent to distortion compensating circuit 20 described in FIG. 1.

Power amplifying element 42 is formed of a GaAs HBT (Heterojunction Bipolar Transistor), which is a bipolar transistor, and distortion compensating circuit 48 is provided in a preceding stage of power amplifying element 42.

A diode 49 in distortion compensating circuit 48 is formed of a Ti/GaAs Schottky diode having a turn-on voltage of 0.6 V. A bias voltage applied to the diode and a current density of a direct bias current are set at 0.5 V and 1 A/cm$^2$, respectively. Specifically, the bias voltage applied to the diode is set at not more than the turn-on voltage. The direct bias current in power amplifying element 42 is reduced for highly efficient operation, and power amplifying element 42 operates in a state where gain increases with an increase in output power before the output power is saturated, that is, in a state where positive gain deviation occurs.

Figure 5:
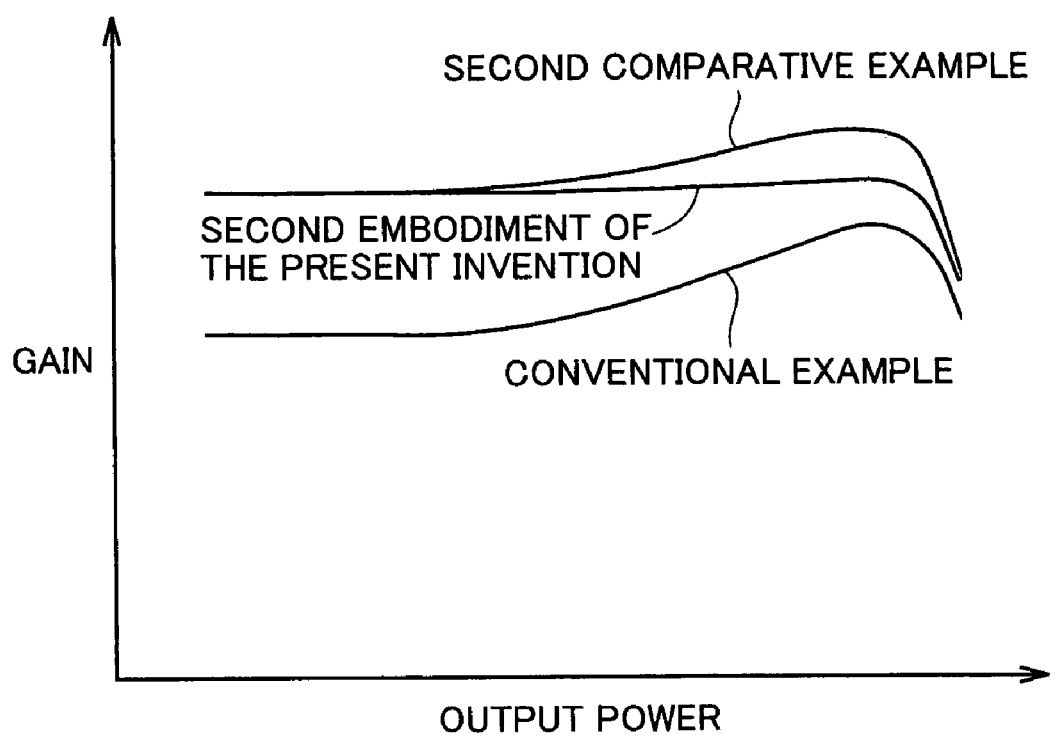
FIG. 5 illustrates relationship between output power and gain of the power amplifier in accordance with the second embodiment of the present invention, gain of a power amplifier in a second comparative example not using a distortion compensating circuit, and gain of a conventional power amplifier.

Referring to FIG. 5, explanation will be given on relationship between output power and gain of the power amplifier in accordance with the second embodiment of the present invention, gain of a power amplifier in a second comparative example not using a distortion compensating circuit, and gain of a conventional power amplifier.

As shown in FIG. 5, in the power amplifier in accordance with the second embodiment of the present invention, gain deviation is suppressed until higher output power, when compared to the power amplifier in the second comparative example not using a distortion compensating circuit and the conventional power amplifier. As a result, linear output of the power amplifier is improved, implementing a power amplifier achieving operation with high linearity and high efficiency.

As described above, according to the power amplifier in accordance with the second embodiment of the present invention, even when the direct bias current in the power amplifying element is reduced to a level in which positive gain deviation occurs for highly efficient operation, the positive gain deviation can be cancelled by negative gain deviation of the distortion compensating circuit. Accordingly, gain deviation of the power amplifier can be suppressed, improving linear output of the power amplifier. Thus, a power amplifier achieving operation with high linearity and high efficiency can be provided.

It is to be noted that, although the power amplifier in accordance with the second embodiment of the present invention has been described to have distortion compensating circuit 48 in the preceding stage of power amplifying element 42, the structure of the power amplifier is not limited to the one described above, and it may also be formed to have distortion compensating circuit 48 in a subsequent stage of power amplifying element 42.

When distortion compensating circuit 48 is provided in the preceding stage of power amplifying element 42, signal power level in distortion compensating circuit 48 is lower than that in the structure having distortion compensating circuit 48 in the subsequent stage of the power amplifying element. Accordingly, efficiency reduction due to power loss by distortion compensating circuit 48 can be minimized.

Further, although distortion compensating circuit 48 is provided to be directly connected to the preceding stage of power amplifying element 42 in the present embodiment, the structure of the power amplifier is not limited to the one described above, and it may also be formed such that for example a portion of input matching circuit 44 is inserted between distortion compensating circuit 48 and the preceding stage of power amplifying element 42.

Furthermore, although a GaAs HBT is used as the power amplifying element in the present embodiment, another bipolar transistor such as a Si bipolar transistor, a SiGe HBT, or a InP HBT may also be used for implementation.

Further, although a bipolar transistor is used as the power amplifying element in the present embodiment, an FET (Field-Effect Transistor) may be applied as the power amplifying element.

It is to be noted that a power amplifier with linearity and efficiency improved more effectively can be designed by using a bipolar transistor as a power amplifying element. This is because, since positive gain deviation of the power amplifying element which occurs when the direct bias current is reduced occurs associated with the movement of the bias point of the power amplifying element caused by an increase in input power, a bipolar transistor in which the direct bias current changes exponentially with respect to a base bias voltage has greater positive gain deviation than that of a field effect transistor in which the direct bias current changes in proportion to the square root of a gate bias voltage.

Further, although a Ti/GaAs Schottky diode is used as the diode in the present embodiment, a Schottky diode using another metal/semiconductor junction such as Al/Si can also be applied. Furthermore, other than a Schottky diode, a pn junction diode or a PIN diode can also be used for implementation.

Third Embodiment

Figure 6:
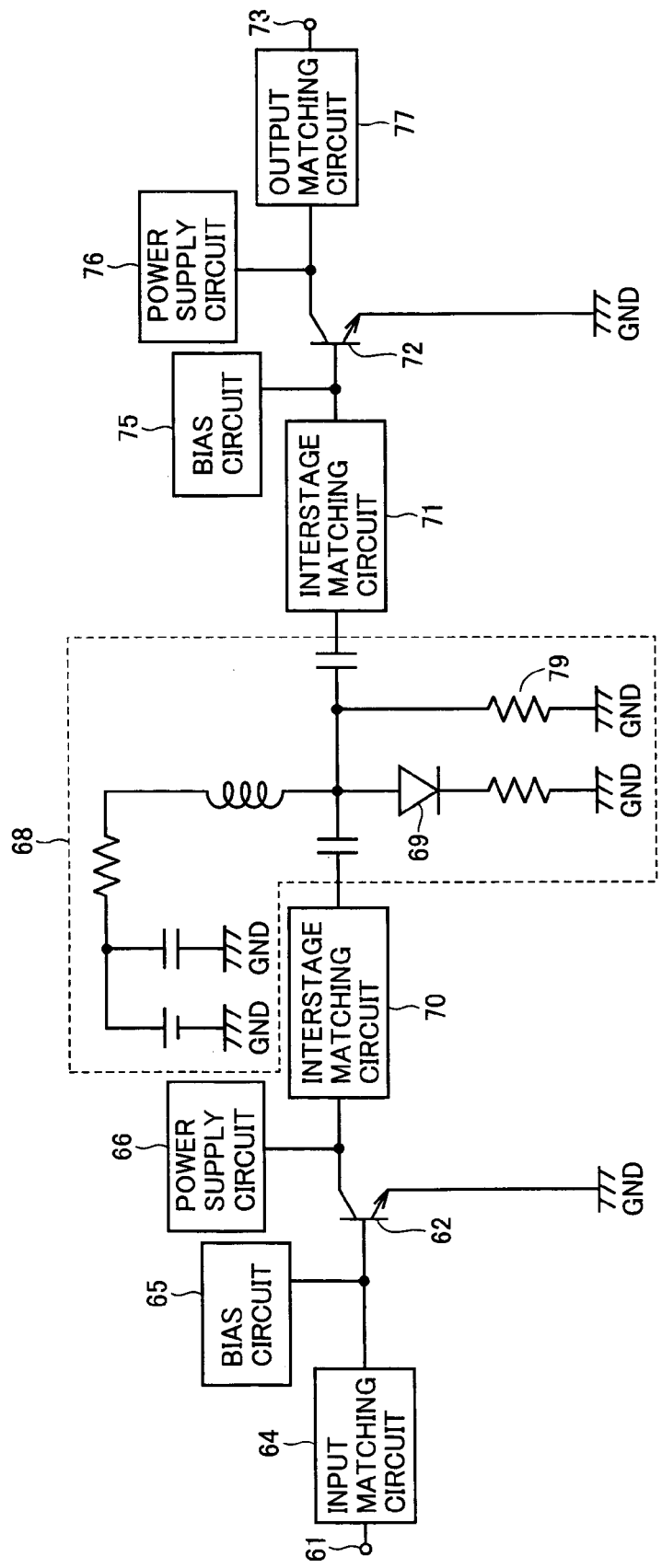
FIG. 6 is a circuit block diagram of a power amplifier in accordance with a third embodiment of the present invention.

Referring to FIG. 6, a power amplifier 60 in accordance with a third embodiment of the present invention has a multi-stage structure using two stages of power amplifying elements. Power amplifier 60 has an input terminal 61, power amplifying elements 62 and 72, an input matching circuit 64, bias circuits 65 and 75 on the input side of power amplifying elements 62 and 72, respectively, power supply circuits 66 and 76 on the output side of power amplifying elements 62 and 72, respectively, a distortion compensating circuit 68, interstage matching circuits 70 and 71, an output terminal 73, and an output matching circuit 77.

Power amplifying elements 62 and 72 are formed of GaAs HBTs, which are bipolar transistors. A diode 69 in distortion compensating circuit 68 is formed of a pn junction diode made of a base-collector junction of a GaAs HBT. By forming diode 69 on the same semiconductor chip as the power amplifying elements, miniaturization and cost reduction of a power amplifier can be achieved. It is to be noted that distortion compensating circuit 68 is equivalent to distortion compensating circuit 20 described in FIG. 1 except that a resistor 79 is additionally provided.

Distortion compensating circuit 68 is provided in a preceding stage of power amplifying element 72 in the final stage of the multi-stage power amplifier, via interstage matching circuit 71. Resistor 79 as a bias circuit for setting the voltage applied to the diode at a forward bias voltage of not more than a turn-on voltage is connected in parallel with the diode.

The direct bias current in power amplifying element 72 in the final stage is reduced for highly efficient operation, and power amplifying element 72 operates in a state where gain increases with an increase in output power before the output power is saturated, that is, in a state where positive gain deviation occurs.

Figure 7:
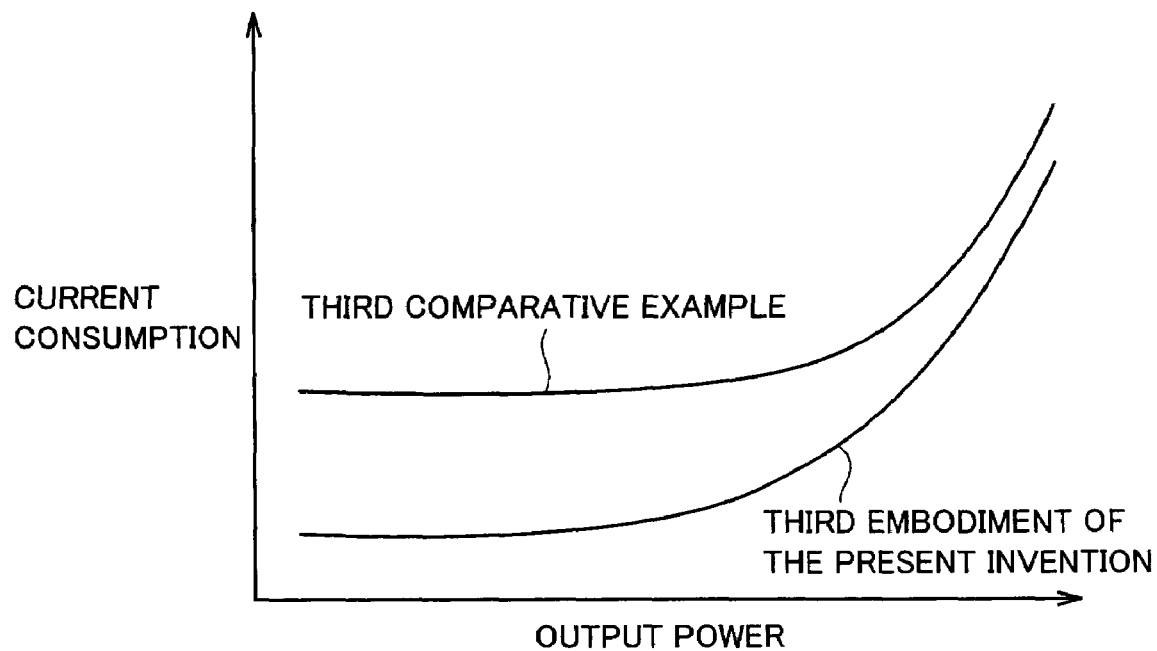
FIG. 7 illustrates relationship between current consumption and output power in the power amplifier in accordance with the third embodiment and in a power amplifier in a third comparative example.

Referring to FIG. 7, explanation will be given on relationship between current consumption and output power in the power amplifier in accordance with the third embodiment and in a power amplifier in a third comparative example. It is to be noted that a power amplifier not using distortion compensating circuit 68 in the structure in accordance with the third embodiment will be described as the power amplifier in the third comparative example. In this case, the power amplifier in the third comparative example should have a greater direct bias current than that in the power amplifier in accordance with the third embodiment of the present invention to obtain the same linearity as that in the third embodiment. With this arrangement, the power amplifier in the third comparative example operates to obtain the same linearity.

Here, the direct bias current in the power amplifying element in the final stage in the third comparative example is about three times that in the third embodiment. As can be seen from FIG. 7, in comparison to the third comparative example in which high linearity is obtained by increasing the direct bias current without using a distortion compensating circuit, the power amplifier in accordance with the third embodiment of the present invention consumes less current throughout the range of the output power, implementing a power amplifier achieving operation with high linearity and high efficiency.

As described above, according to the power amplifier in accordance with the third embodiment of the present invention, even when the direct bias current in the power amplifying element is reduced to a level in which positive gain deviation occurs for highly efficient operation, the positive gain deviation can be cancelled by negative gain deviation of the distortion compensating circuit, and gain deviation of the power amplifier can be suppressed. Consequently, a power amplifier capable of reducing power consumption while maintaining linear output of the power amplifier can be provided.

Further, according to the power amplifier in accordance with the third embodiment of the present invention, since the diode in the distortion compensating circuit is formed of a pn junction diode made of a base-collector junction (or an emitter-base junction) of a GaAs HBT, the diode can be formed on the same semiconductor chip as the power amplifying elements, and thus miniaturization and cost reduction of the power amplifier can be achieved.

It is to be noted that, although the distortion compensating circuit is provided only in the preceding stage of the power amplifying element in the final stage in the power amplifier in accordance with the present embodiment, it is of course possible that the distortion compensating circuit may be provided in a preceding stage or a subsequent stage of either power amplifying element.

Further, the distortion compensating circuit can be provided in a preceding stage of the power amplifying element in the final output stage of a multi-stage power amplifier including a plurality of the power amplifying elements. Since the multi-stage power amplifier has the greatest output at the power amplifying element in the final output stage, which exerts the greatest effect on the efficiency of the power amplifier, linearity and efficiency can be improved more effectively when the distortion compensating circuit is provided in the preceding stage of the power amplifying element in the final output stage.

Furthermore, although the distortion compensating circuit is provided in the preceding stage of the power amplifying element in the final stage via the interstage matching circuit, the distortion compensating circuit can also be provided to be directly connected with the preceding stage of the power amplifying element.

Further, although explanation has been given on the diode in the present embodiment using a pn junction diode made of a base-collector junction of a bipolar transistor, another diode such as a pn junction diode made of an emitter-base junction may also be used for implementation.

Furthermore, although a GaAs HBT is used as the power amplifying element in the present embodiment, another bipolar transistor such as a Si bipolar transistor, a SiGe HBT, or a InP HBT may also be used.

Further, although the power amplifier in the present embodiment has been described as a multi-stage structure using two stages of the power amplifying elements, the present embodiment may also be applied to a multi-stage structure using three or more stages of the power amplifying elements.

Fourth Embodiment

Figure 8:
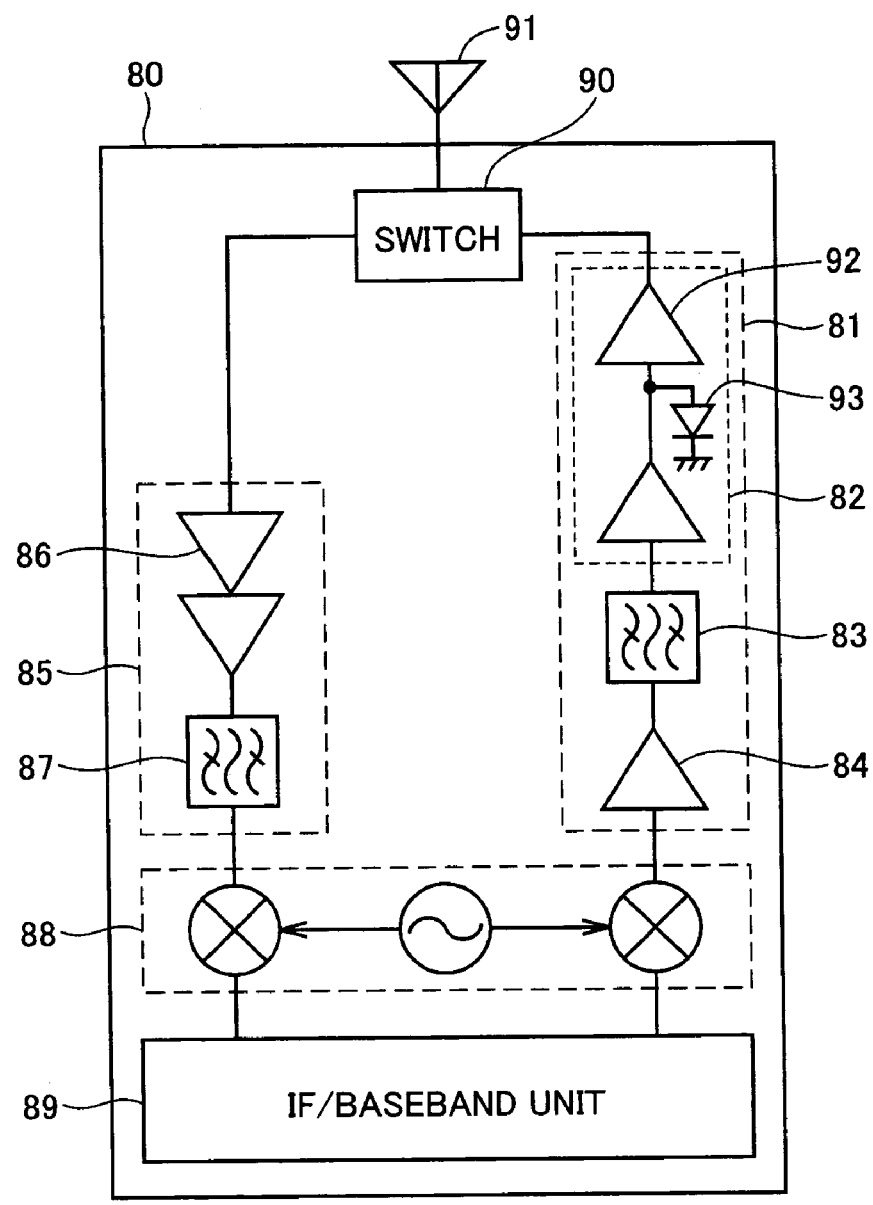
FIG. 8 is a schematic block diagram showing a structure of main units of a communication device in accordance with a fourth embodiment of the present invention.
Figure 9:
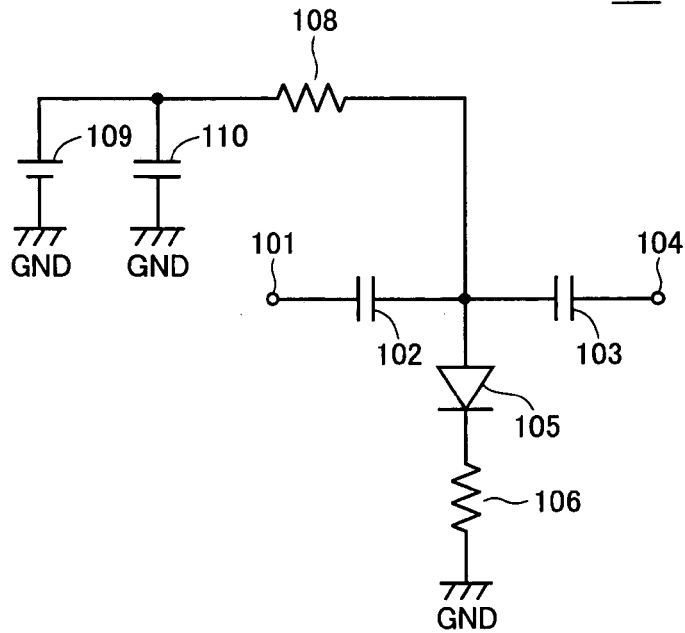
FIG. 9 is a circuit block diagram of a conventional distortion compensating circuit.
Figure 10:
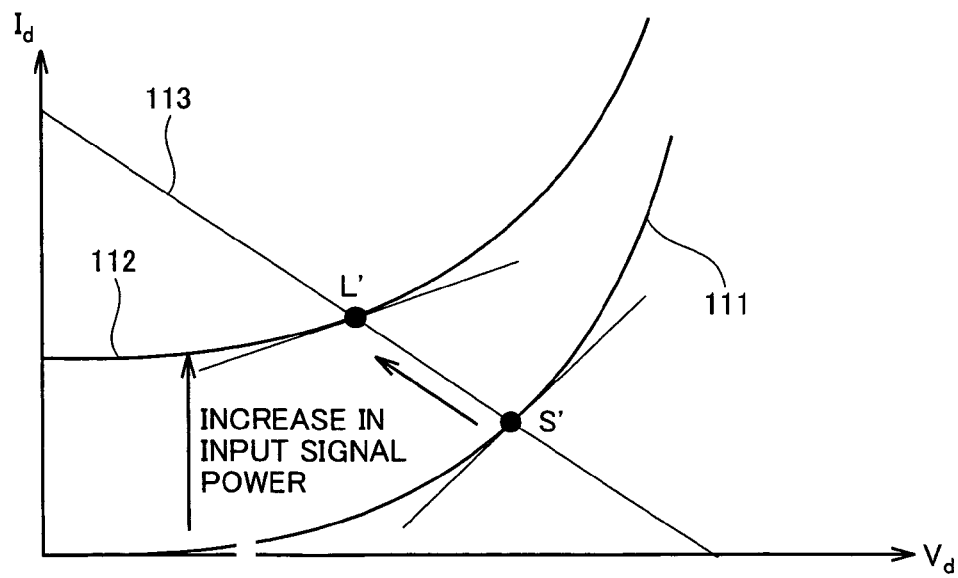
FIG. 10 illustrates movement of a bias point in the conventional distortion compensating circuit.
Figure 11:
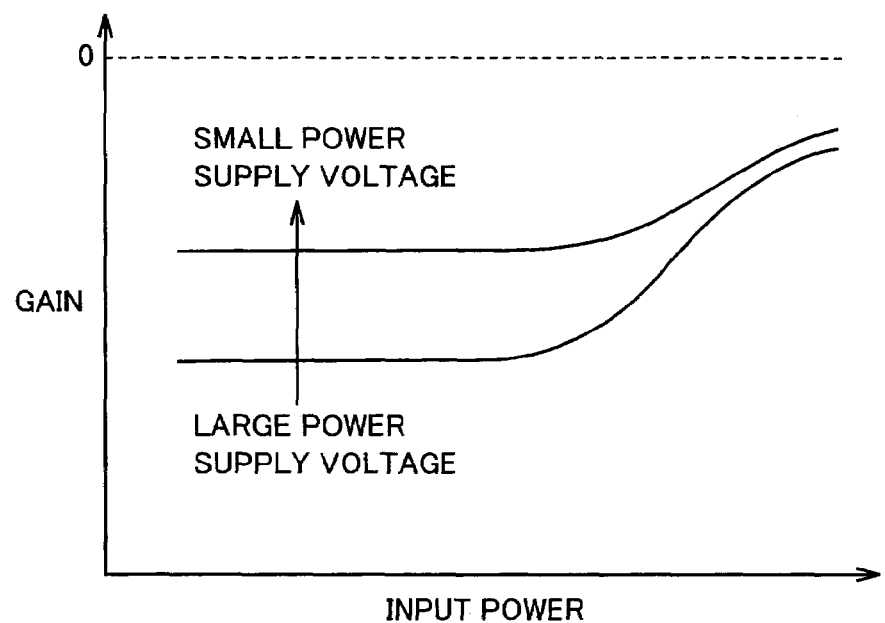
FIG. 11 illustrates relationship between input power and gain, that is, power ratio between an output signal and an input signal, of a conventional distortion compensating circuit.
Figure 12:
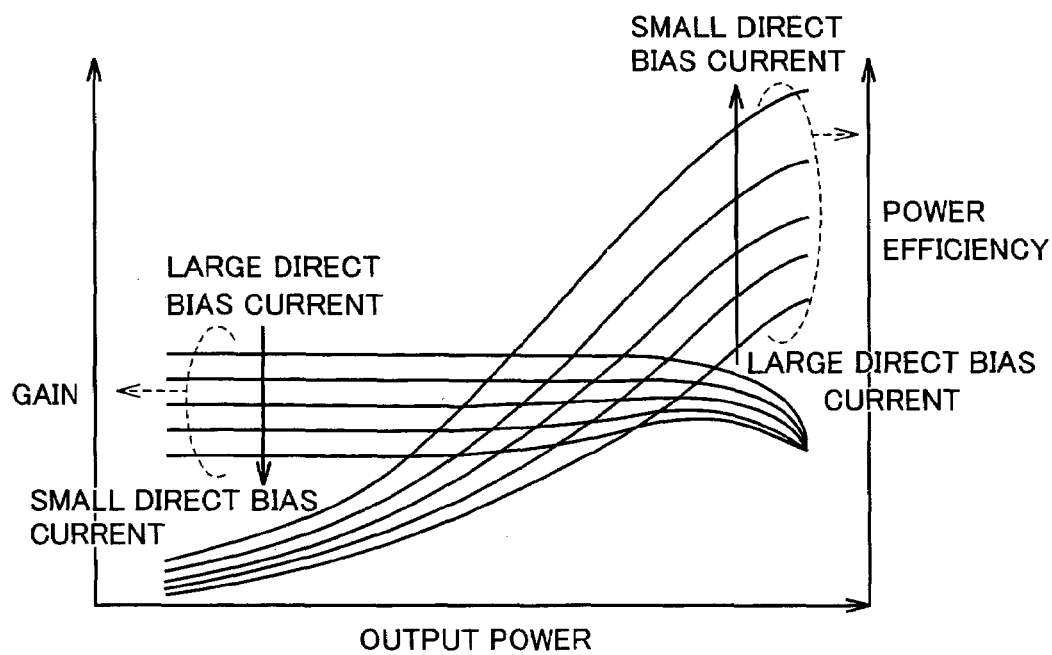
FIG. 12 illustrates relationship between output power and both gain and power efficiency of a power amplifying element.

Referring to FIG. 8, a communication device 80 in accordance with a fourth embodiment of the present invention has, as main units, an RF unit for transmission 81 including a power amplifier 82 with the multi-stage structure described in the third embodiment of the present invention, a filter 83, a driver amplifier 84, and the like; an RF unit for reception 85 including a low-noise amplifier 86, a filter 87, and the like; a frequency converting unit 88 converting between an RF signal and an IF (intermediate frequency) signal; an IF/baseband unit 89; a switch 90; and an antenna 91. Power amplifier 82 with the multi-stage structure has a distortion compensating circuit 93 provided in a preceding stage of a power amplifying element 92 in the final stage.

Since RF unit for transmission 81 including driver amplifier 84, power amplifier 82, and the like handles the greatest signal power within communication device 80, the amplifier consumes large power and distortion is likely to occur during amplification. In the fourth embodiment, however, by using the power amplifier described above within RF unit for transmission 81, a transmission signal can be amplified to reach a predetermined antenna output with high linearity and low power consumption, achieving reduced power consumption of communication device 80.

Further, since an amplifier stage closer to antenna 91 amplifies greater signal power, it is more effective to use the power amplifier of the present invention as an amplifier closer to the antenna in order to achieve lower power consumption of communication device 80. Furthermore, a duration for communication until a battery is exhausted can be extended, which is important for a battery-driven mobile terminal using a lithium-ion battery, a nickel-hydride battery, or the like represented by a mobile phone as communication device 80. Further, if the duration for communication is the same as a conventional duration, a smaller-sized battery can be used, implementing a smaller and lighter communication device.

Furthermore, when the communication device in accordance with the fourth embodiment of the present invention is used in a communication system requiring adjacent channel leakage power and stringent low-noise characteristic represented by the EVM (Error Vector Magnitude) standard for a power amplifier for transmission, such as a wireless LAN compliant with W-CDMA (Wideband Code Division Multiple Access), IEEE802.11a, or the like, reduction in distortion and increase in efficiency in the power amplifier for transmission can be achieved simultaneously, and thus a communication device having a sufficient effect, that is, a communication device with smaller size and reduced power consumption, can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A distortion compensating circuit and having a negative gain deviation for an amplifier circuit having a positive gain deviation, comprising:
   a circuit including a diode having a predetermined turn-on voltage connected between a signal path including the amplifier circuit and ground,
   a voltage applied to said diode comprising a forward bias voltage of a value less than the turn-on voltage of said diode, and
   wherein an amount of change in a ratio between output power output from the signal path and input power input to the signal path with respect to the input power is substantially zero or negative.

2. The distortion compensating circuit according to claim 1, wherein the voltage applied to said diode is a forward bias voltage having a current density of a direct bias current flowing to said diode of not more than $10^2$ A/cm$^2$.

3. A power amplifier, comprising:
   a power amplifying element having positive gain deviation with an increase in output power, and
   a distortion compensating circuit having a negative gain deviation and including a diode connected between a signal path including an input terminal and an output terminal and ground,
   a voltage applied to said diode comprising a forward bias voltage less than a turn-on voltage, and
   wherein an amount of change in a ratio between output power output from the signal path and input power input to the signal path with respect to the input power is about zero or negative.

4. The power amplifier according to claim 3, wherein said distortion compensating circuit is provided in a preceding stage of said power amplifying element.

5. The power amplifier according to claim 3, wherein said power amplifying element comprises a bipolar transistor.

6. The power amplifier according to claim 3, wherein said diode comprises a pn junction diode including an emitter-base junction or a base-collector junction of a bipolar transistor.

7. The power amplifier according to claim 3, wherein said distortion compensating circuit is provided at least in a preceding stage of the power amplifying element in a final output stage of a multi-stage power amplifier including a plurality of the power amplifying elements.

8. A communication device, comprising a power amplifier,
   wherein said power amplifier includes:
   a power amplifying element having positive gain deviation with an increase in output power, and
   a distortion compensating circuit having a negative gain deviation including a diode connected between a signal path including said power amplifying element and ground providing a leakage current path and being poled so as to becoming more conductive and, providing an increase in leakage current to ground,
   a forward bias voltage applied to said diode which is less than a turn-on voltage of said diode, and
   wherein an amount of change in a ratio between output power output from the signal path and input power input to the signal path with respect to the input power is substantially zero or negative.

9. The communication device according to claim 8, wherein said power amplifier is a power amplifier for transmission.

10. The power amplifier according to claim 3 wherein said signal path includes an input terminal and an output terminal;
    a first capacitor connected in said signal path between said input terminal and a connecting node connected to said diode;
    a second capacitor connected in said signal path between said connecting node and said output terminal; and
    at least one electrical impedance element connecting a source of bias voltage to said connecting diode.

11. The power amplifier according to claim 10 wherein said at least one impedance element comprises a resistor.

12. The power amplifier according to claim 10 wherein said at least one electrical impedance element comprises an inductor.

13. The power amplifier according to claim 10 wherein said at least one electrical impedance element comprises an induction and a resistor connected in series between the source of bias voltage and said connecting node.

14. The power amplifier according to claim 10 and additionally including a capacitor connected from said source of bias voltage and ground.

15. The power amplifier according to claim 6 wherein said power amplifying element and said diode are formed on a common semiconductor chip.

* * * * *